(12) United States Patent
Yata

(10) Patent No.: US 7,330,089 B2
(45) Date of Patent: Feb. 12, 2008

(54) BALANCED ACOUSTIC WAVE FILTER DEVICE

(75) Inventor: Masaru Yata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/672,241

(22) Filed: Feb. 7, 2007

(65) Prior Publication Data

US 2007/0126531 A1 Jun. 7, 2007

Related U.S. Application Data

(63) Continuation of application No. PCT/JP05/24036, filed on Dec. 28, 2005.

(30) Foreign Application Priority Data

Feb. 16, 2005 (JP) .............................. 2005-039630

(51) Int. Cl.
*H03H 9/64* (2006.01)

(52) U.S. Cl. ...................... 333/195; 333/196

(58) Field of Classification Search ............... 333/193, 333/195

See application file for complete search history.

(56) References Cited

U.S. PATENT DOCUMENTS

| | | | |
|---|---|---|---|
| 5,994,980 A * | 11/1999 | Tada | ........................ 333/193 |
| 6,731,188 B2 | 5/2004 | Sawada et al. | |
| 6,744,333 B2 | 6/2004 | Sawada | |
| 6,828,878 B2 * | 12/2004 | Takamine et al. | ........... 333/193 |
| 6,891,451 B2 * | 5/2005 | Sawada | ..................... 333/195 |
| 7,042,313 B2 | 5/2006 | Yata | |
| 2004/0000842 A1 | 1/2004 | Yata | |

(Continued)

FOREIGN PATENT DOCUMENTS

JP 01-212015 A 8/1989

(Continued)

OTHER PUBLICATIONS

Official Communication for PCT Application No. PCT/JP2005/024036; mailed on Mar. 28, 2006.

*Primary Examiner*—Barbara Summons
(74) *Attorney, Agent, or Firm*—Keating & Bennett, LLP

(57) ABSTRACT

In a balanced acoustic wave filter device, first and second acoustic wave filter sections that are connected in parallel to an unbalanced terminal are connected to first and second balanced terminals, respectively. The first and second surface acoustic wave filter sections are configured such that the phases of the first and second balanced terminals differ by 180 degrees. The first and second acoustic wave filter sections are longitudinally coupled resonator-type acoustic wave filter sections each including a plurality of IDTs disposed in a direction in which acoustic waves propagate. The total number of pairs of electrode fingers of the IDTs in the second acoustic wave filter section in which the polarities of electrode fingers that are adjacent to each other in an area in which IDTs are adjacent to each other are opposite to each other is greater than the total number of pairs of electrode fingers of the IDTs in the first acoustic wave filter section in which the polarities of electrode fingers that are adjacent to each other in an area in which IDTs are adjacent to each other in the direction in which acoustic waves propagate are equal to each other.

14 Claims, 7 Drawing Sheets

U.S. PATENT DOCUMENTS

| | | | |
|---|---|---|---|
| 2004/0066254 A1* | 4/2004 | Shibahara | 333/195 |
| 2004/0077325 A1* | 4/2004 | Takamine | 455/286 |
| 2004/0080383 A1* | 4/2004 | Takamine | 333/194 |
| 2005/0001699 A1* | 1/2005 | Takamine | 333/195 |
| 2005/0057323 A1 | 3/2005 | Kando | |

FOREIGN PATENT DOCUMENTS

| | | |
|---|---|---|
| JP | 07-307625 A | 11/1995 |
| JP | 2001-308672 A | 11/2001 |
| JP | 2002-290205 A | 10/2002 |
| JP | 2003-078387 A | 3/2003 |
| JP | 2003-273707 A | 9/2003 |
| JP | 2004-080260 A | 3/2004 |
| JP | 2004-159262 A | 6/2004 |

* cited by examiner

BALANCED ACOUSTIC WAVE FILTER DEVICE

BACKGROUND OF THE INVENTION

1. Field of the Invention

The present invention relates to balanced acoustic wave filter devices using surface acoustic waves or boundary acoustic waves, and more particularly, to a balanced acoustic wave filter device including first and second longitudinally coupled resonator-type acoustic wave filter sections and having a balanced-to-unbalanced conversion function.

2. Description of the Related Art

In mobile communication apparatuses, surface acoustic wave filters are often connected as band-pass filters between antennas and differential amplifiers. In this case, unbalanced signals are input or output to an antenna. In contrast, balanced signals are input or output to a differential amplifier. Thus, a component having an unbalanced-to-balanced conversion function, that is, a balun, must be inserted between the antenna and the differential amplifier. If a surface acoustic wave filter having a balanced-to-unbalanced conversion function is used as the above-mentioned band-pass filter, the balun may be omitted. Thus, various balanced surface acoustic wave filters having the balanced-to-unbalanced conversion function have been proposed.

Japanese Unexamined Patent Application Publication No. 2003-78387 (Patent Document 1), which will be described below, discloses a balanced surface acoustic wave filter device whose electrode structure is shown by a schematic plan view illustrated in FIG. 14. As shown in FIG. 14, in a balanced surface acoustic wave filter device 501, electrodes are provided on a piezoelectric substrate. That is, the electrodes are arranged to define a first longitudinally coupled resonator-type surface acoustic wave filter section 502 and a second longitudinally coupled resonator-type surface acoustic wave filter section 503.

The first surface acoustic wave filter section 502 includes first to third IDTs 511 to 513 disposed along a surface-acoustic-wave propagation direction. The second surface acoustic wave filter section 503 also includes fourth to sixth IDTs 514 to 516 disposed along the surface-acoustic-wave propagation direction. Reflectors 517a and 517b are provided on both sides in the surface-acoustic-wave propagation direction of an area in which the IDTs 511 to 513 are disposed. Similarly, reflectors 518a and 518b are provided on both sides in the surface-acoustic-wave propagation direction of an area in which the IDTs 514 to 516 are disposed.

That is, the surface acoustic wave filter sections 502 and 503 are longitudinally coupled resonator-type surface acoustic wave filter sections each defined by three IDTs having the above-mentioned electrode structure.

In addition, first ends of the IDTs 512 and 515, which are disposed at the centers of the first and second surface acoustic wave filter sections 502 and 503, respectively, are connected to an unbalanced terminal 504. Second ends of the IDTs 512 and 515 are connected to a ground potential.

First ends of the IDTs 511 and 513 are commonly connected to a first balanced terminal 505. Second ends of the IDTs 511 and 513 are connected to the ground potential. In contrast, first ends of the IDTs 514 and 516, which are disposed on both sides in the second surface acoustic wave filter section 503, are commonly connected to a second balanced terminal 506. Second ends of the IDTs 514 and 516 are connected to the ground potential.

In the surface acoustic wave filter device 501, the phase of the IDT 512 is opposite to the phase of the IDT 515. Thus, the phase of a signal flowing to the first balanced terminal 505 differs from the phase of a signal flowing to the second balanced terminal 506 by 180 degrees.

Since the surface acoustic wave filter device 501 is configured as described above, the surface acoustic wave filter device 501 has a balanced-to-unbalanced conversion function.

However, in the surface acoustic wave filter device 501, satisfactory insertion loss and VSWR in a pass band cannot be achieved. That is, in the surface acoustic wave filter device 501, since the polarity of the IDT 512 is opposite to the polarity of the IDT 515, the phases of signals extracted from the first and second balanced terminals 505 and 506 differ from each other by 180 degrees.

Thus, in a gap in which IDTs are adjacent to each other, the polarities of a pair of adjacent electrode fingers differ between the first surface acoustic wave filter section 502 and the second surface acoustic wave filter section 503. For example, in the first surface acoustic wave filter section 502, each of the electrode fingers that are adjacent to each other across a gap between the IDTs 511 and 512 is connected to a corresponding signal terminal, and each of the electrode fingers that are adjacent to each other across a gap between the IDTs 512 and 513 is connected to a corresponding signal terminal. Thus, surface acoustic waves are not excited very strongly between the IDTs 511 and 512 and between the IDTs 512 and 513.

In contrast, one of the electrode fingers that face each other through a gap between the IDTs 514 and 515 in the second surface acoustic wave filter section 503 is connected to a signal terminal, and the other one of the electrode fingers is connected to the ground potential. Similarly, one of the electrode fingers that are adjacent to each other between the IDTs 515 and 516 is connected to the ground potential, and the other one of the electrode fingers is connected to a signal terminal. Thus, in the gap between the IDTs 514 and 515 and the gap between the IDTs 515 and 516, surface acoustic waves are excited relatively strongly. Thus, a bandwidth tends to be increased.

Therefore, the excitation states of surface acoustic waves in gaps in the first longitudinally coupled resonator-type surface acoustic wave filter section 502 and the second longitudinally coupled resonator-type surface acoustic wave filter section 503 differ from each other. This causes a difference in bandwidths and deteriorates the VSWR and the insertion loss in the pass band.

SUMMARY OF THE INVENTION

To overcome the problems described above, preferred embodiments of the present invention provide a balanced surface acoustic wave filter device having a balanced-to-unbalanced conversion function, including first and second longitudinally coupled resonator-type surface acoustic wave filter sections connected to an unbalanced terminal, and having a structure which reduces the insertion loss and the VSWR in a pass band.

According to a preferred embodiment of the present invention, a balanced acoustic wave filter device includes a piezoelectric substrate and first and second longitudinally coupled resonator-type acoustic wave filter sections provided on the piezoelectric substrate. Each of the first and second acoustic wave filter sections includes a plurality of IDTs disposed in a direction in which surface acoustic waves propagate. An input or an output of each of the first and second acoustic wave filter sections is connected to an unbalanced terminal, the output or the input of the first acoustic wave filter section is connected to a first balanced terminal, the output or the input of the second acoustic wave filter section is connected to a second balanced terminal, and the phase of a signal of the output or the input of the first acoustic wave filter section is different from the phase of a signal of the output or the input of the second acoustic wave filter section by 180 degrees. In the first acoustic wave filter section, the polarities of electrode fingers that are adjacent to each other in an area in which the IDTs are adjacent to each other in a direction in which acoustic waves propagate are equal to each other, and in the second acoustic wave filter section, the polarities of electrode fingers that are adjacent to each other in an area in which the IDTs are adjacent to each other are opposite to each other. The total number of pairs of electrode fingers in the second acoustic wave filter section is greater than the total number of pairs of electrode fingers in the first acoustic wave filter section.

The balanced acoustic wave filter device may further include at least one third longitudinally coupled resonator-type surface acoustic wave filter section that is connected in a cascade arrangement to the first acoustic wave filter section and at least one fourth longitudinally coupled resonator-type surface acoustic wave filter section that is connected in a cascade arrangement to the second acoustic wave filter section.

In the areas in which the IDTs are adjacent to each other, each of the IDTs may include a narrow-pitched electrode finger portion having an electrode finger pitch that is narrower than an electrode finger pitch of the other portions of the corresponding IDT.

Surface acoustic waves may be used as the acoustic waves, and a surface acoustic wave filter device may be configured using the surface acoustic waves.

Alternatively, boundary acoustic waves may be used as the acoustic waves, and a boundary acoustic wave filter device may be configured using the boundary acoustic waves.

In preferred embodiments of the present invention, the input or the output of each of the first and second acoustic wave filter sections is connected to the unbalanced terminal, the output or the input of the first acoustic wave filter section is connected to the first balanced terminal, the output or the input of the second acoustic wave filter section is connected to the second balanced terminal, and the phase of the signal of the output or the input of the first acoustic wave filter section is different from the phase of the signal of the output or the input of the second acoustic wave filter section by 180 degrees. Thus, the balanced acoustic wave filter device having a balanced-to-unbalanced conversion function is provided.

Furthermore, the total number of pairs of electrode fingers in the second acoustic wave filter section in which the polarities of the electrode fingers that are adjacent to each other in the area in which the IDTs are adjacent to each other are opposite to each other is greater than the total number of pairs of electrode fingers in the first acoustic wave filter section in which the polarities of the electrode fingers that are adjacent to each other in the area in which the IDTs are adjacent to each other in the direction in which the acoustic waves propagate are ground and ground or hot and hot. Thus, the insertion loss and the VSWR in the pass band are reduced.

In particular, recently, the insertion loss in the pass band must be as small as possible for band-pass filters used in mobile communication apparatuses and other similar apparatuses. Thus, compared to known balanced surface acoustic wave filter devices, even an improvement of about 0.1 dB in insertion loss achieves a significant advantage in the reduction of insertion loss. According to preferred embodiments of the present invention, the insertion loss in the pass band is effectively improved. Thus, an opportunity to use a balanced acoustic wave filter device as a band-pass filter of a communication apparatus or other similar apparatus is further improved.

If at least one third longitudinally coupled resonator-type surface acoustic wave filter section and at least one fourth longitudinally coupled resonator-type surface acoustic wave filter section that are connected in a cascade arrangement to the first and second acoustic wave filter sections, respectively, are provided, an attenuation outside the band is increased.

If, in the areas in which the IDTs are adjacent to each other, each of the IDTs includes a narrow-pitched electrode finger portion having an electrode finger pitch that is narrower than an electrode finger pitch of the other portions of the corresponding IDT, discontinuity in the areas in which the IDTs are adjacent to each other is reduced. Thus, the insertion loss in the band is further reduced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The present invention will become apparent from the following descriptions of preferred embodiments of the present invention with reference to the drawings.

Figure 1:
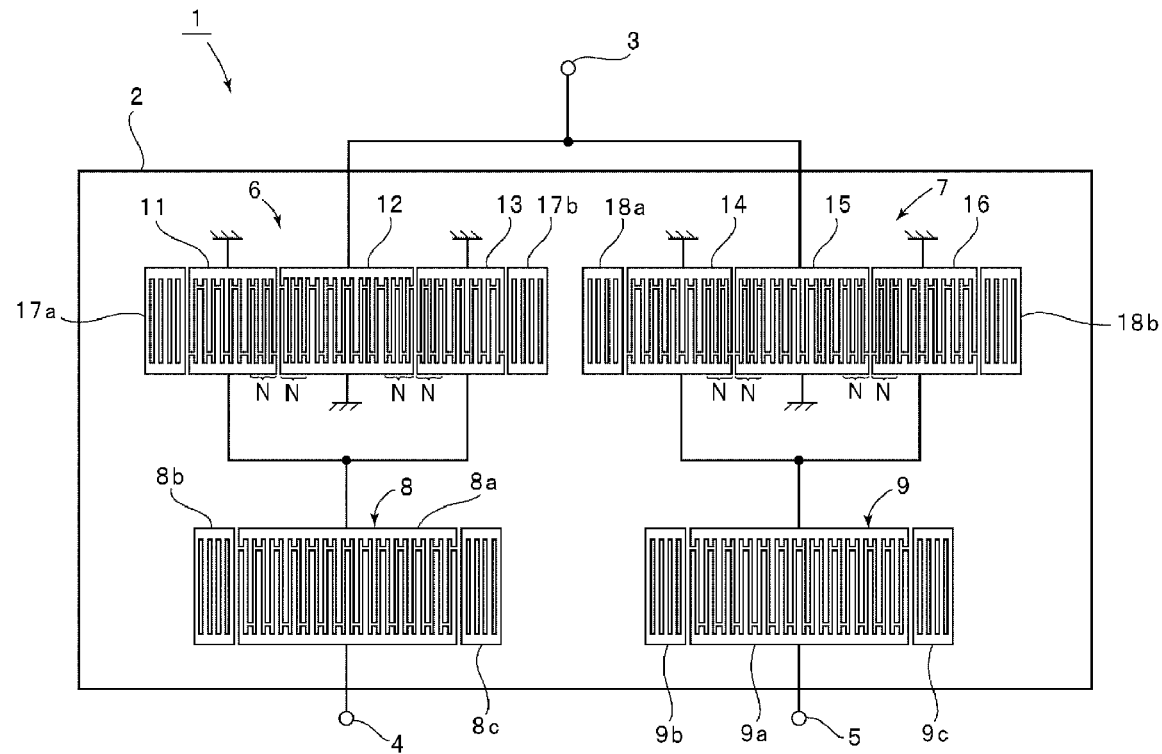
FIG. 1 is a schematic plan view of a surface acoustic wave filter device according to a first preferred embodiment of the present invention.

FIG. 1 is a schematic plan view showing a balanced surface acoustic wave filter device according to a first preferred embodiment of the present invention.

A balanced surface acoustic wave filter device 1 has an electrode structure shown in FIG. 1 provided on a piezoelectric substrate 2.

In this preferred embodiment, the piezoelectric substrate 2 is preferably a piezoelectric substrate made of 40±5-degree Y-cut, X-propagating LiTaO$_3$. However, the piezoelectric substrate may be made of other types of piezoelectric single crystal or piezoelectric ceramics. In addition, the piezoelectric substrate may be configured such that a piezoelectric thin film is formed on the surface of a piezoelectric material or an insulating material.

Although the illustrated electrodes are preferably made of aluminum in this preferred embodiment, the electrodes may be made of aluminum alloy, other types of metal, or other types of alloy. In addition, the electrodes may be made by laminating a plurality of electrode layers.

The balanced surface acoustic wave filter device 1 includes an unbalanced terminal 3 and first and second balanced terminals 4 and 5. First and second longitudinally coupled resonator-type surface acoustic wave filter sections 6 and 7 are connected in parallel to the unbalanced terminal 3.

The first surface acoustic wave filter section 6 is a longitudinally coupled resonator-type surface acoustic wave filter section having three IDTs, first to third IDTs 11 to 13, disposed along a direction in which surface acoustic waves propagate. The IDT 12 disposed in the middle is electrically connected to the above-described unbalanced terminal 3. Reflectors 17a and 17b are disposed on both sides in the direction in which surface acoustic waves propagate of an area in which the IDTs 11 to 13 are provided.

First ends of the first and third IDTs 11 and 13, which are disposed on both sides of the second IDT 12 disposed in the middle, are commonly connected to the first balanced terminal 4 with a one-port surface acoustic wave resonator 8 therebetween.

Second ends of the first and third IDTs 11 and 13 are connected to the ground potential. An end of the second IDT 12 that is opposite to the end connected to the unbalanced terminal 3 is connected to the ground potential.

Similarly, the second longitudinally coupled resonator-type surface acoustic wave filter section 7 includes fourth to sixth IDTs 14 to 16 disposed in the direction in which surface acoustic waves propagate. The fifth IDT 15 disposed in the middle is connected to the unbalanced terminal 3. An opposite end of the IDT 15 is connected to the ground potential. First ends of the IDTs 14 and 16 are commonly connected to the second balanced terminal 5 with a surface acoustic wave resonator 9 therebetween. Second ends of the IDTs 14 and 16 are connected to the ground potential. Reflectors 18a and 18b are disposed on both sides in the direction in which surface acoustic waves propagate of an area in which the IDTs 14 to 16 are provided.

The phase of the fifth IDT 15 is opposite to the phase of the second IDT 12. Thus, the phase of a signal extracted from the first balanced terminal 4 is different from the phase of a signal extracted from the second balanced terminal 5 by 180 degrees. Accordingly, a balanced-to-unbalanced conversion function is provided.

In this preferred embodiment, in the IDTs 11 to 13 and IDTs 14 to 16, the IDTs each include a narrow-pitched electrode finger portion in an area in which the IDTs are adjacent to each other. The structure of a narrow-pitched electrode finger potion N, which is provided in an area in which the IDT 11 and the IDT 12 are adjacent to each other, will now be described. In the area in which the IDT 11 and the IDT 12 are adjacent to each other across a gap therebetween, the pitch of at least two electrode fingers from an end of the IDT 11 near the IDT 12 is smaller than the pitches of the other electrode fingers of the IDT 11. Thus, the at least two electrode fingers having the narrow electrode finger pitch define the narrow-pitched electrode finger portion N. The narrow-pitched electrode finger portion N is also provided in an end of the IDT 12 near the IDT 11. Since the narrow-pitched electrode finger portions N are provided, the discontinuity in propagation of surface acoustic waves in the gap between the IDT 11 and the IDT 12 is reduced. Thus, the insertion loss in a pass band is further reduced.

In the present invention, a narrow-pitched electrode finger portion N is not necessarily provided in an area in which IDTs are adjacent to each other.

A feature of the surface acoustic wave device 1 according to this preferred embodiment is that the total number of pairs of electrode fingers in the second surface acoustic wave filter section 7 is greater than the total number of pairs of electrode fingers in the first surface acoustic wave filter section 6 and that the insertion loss and the VSWR in the pass band are thus reduced. This feature will be described in more detail with reference to FIGS. 2 to 7.

The surface acoustic wave filter device 1 according to the above-mentioned preferred embodiment was prepared in accordance with the specifications given below. The piezoelectric substrate 2 is a 40±5-degree Y-cut, X-propagating LiTaO$_3$ substrate.

First Surface Acoustic Wave Filter Section 6
Film thickness=0.092 $\lambda_1$
Wavelength $\lambda_1$ of IDTs 11 to 13=2.15 μm, Wavelength of narrow-pitched electrode finger portions N of IDTs 11 to 13=1.93 μm Wavelength of reflectors 17a and 17b=2.17 μm Numbers of pairs of electrode fingers of first to third IDTs 11 to 13: IDT 11=8.5/(1.5), IDT 12=(1.5)/13.0/(1.5), IDT 13=(1.5)/8.5. The numbers of pairs of electrode fingers shown in parentheses represent the numbers of pairs of electrode fingers in the narrow-pitched electrode finger portions N, and the numbers of pairs of electrode fingers not shown in parentheses represent the numbers of pairs of electrode fingers in electrode finger portions other than the narrow-pitched electrode finger portions N.

The sum of the numbers of pairs in the first to third IDTs 11 to 13 is 36 (=8.5+1.5+1.5+13.0+1.5+1.5+8.5). However, including the number of gaps between the IDTs, the total number of pairs is 39 (=36+(the number of gaps between IDTs)×0.5).

Number of electrode fingers of reflectors 17a and 17b=80

Distance between IDTs in IDTs 11 to 13 (distance between electrode finger centers)=0.47 μm Distance between reflector 17a and IDT 11 and between reflector 17b and IDT 13=0.49 $\lambda_1$ Cross width of electrode fingers=35.9 $\lambda_1$ Second Surface Acoustic Wave Filter Section 7

Film thickness=0.092 $\lambda_2$

Wavelength $\lambda_2$ of electrode finger portions other than narrow-pitched electrode finger portions N of IDTs 14 to 16=2.15 μm Wavelength of electrode fingers in narrow-pitched electrode finger portions N of IDTs 14 to 16=1.98 μm Number of pairs of electrode fingers of fourth to sixth IDTs 14 to 16: IDT=8.5/(2.5), IDT 15=(1.5)/13.0/(1.5), IDT 16=(2.5)/8.5. The numbers of pairs of electrode fingers shown in parentheses represent the numbers of pairs of electrode fingers in the narrow-pitched electrode finger portions N, and the numbers of pairs of electrode fingers not shown in parentheses represent the numbers of pairs of electrode fingers in electrode finger portions other than the narrow-pitched electrode finger portions N.

The sum of the numbers of pairs in the fourth to sixth IDTs 14 to 16 is 38 (=8.5+2.5+1.5+13.0+1.5+2.5+8.5). However, including the number of gaps between the IDTS, the total number of pairs is 41 (=38+(the number of gaps between IDTs)×0.5).

Number of electrode fingers of reflectors 18a and 18b=80

Wavelength of electrode fingers of reflectors 18a and 18b=2.17 μm

Distance between reflector 18a and IDT 14 and between reflector 18b and IDT 16=0.47 $\lambda_2$ Distance between IDTs in IDTs 14 to 16=0.49 $\lambda_2$ Cross width of electrode fingers=34.6 $\lambda_2$ (Surface Acoustic Wave Resonators 8 and 9)

Film thickness=0.094 $\lambda_3$

Number of pairs of electrode fingers of IDTs 8a and 9a=120

Number of electrode fingers in each of reflectors 8b, 8c, 9b, and 9c=15

Wavelength $\lambda_3$ of IDTs 8a and 9a=2.11 μm

Wavelength of reflectors 8b, 8c, 9b, and 9c=2.11 μm

The cross width of electrode fingers of the IDT 8 is 29.3 $\lambda_3$, and the cross width of electrode fingers of the IDT 9 is 43.1 $\lambda_3$.

Thus, in the surface acoustic wave filter device 1 according to the first preferred embodiment, the total number of pairs of electrode fingers of the IDTs in the first surface acoustic wave filter section 6 is 39, and the total number of pairs of electrode fingers of the IDTs in the second surface acoustic wave filter section 7 is 41. The total number of pairs of electrode fingers of the IDTs in a surface acoustic wave filter section is represented by the equation: total number of pairs=(total number of electrode fingers−1)/2. Thus, the sum of the numbers of pairs of electrode fingers of respective IDTs is not necessarily equal to the total number of pairs of electrode fingers of the IDTs in the surface acoustic wave filter section calculated as described above. In addition, in the present invention, the total number of pairs of electrode fingers of IDTs is important because the total number of pairs of electrode fingers affects a bandwidth and a characteristic in a pass band.

Figure 2:
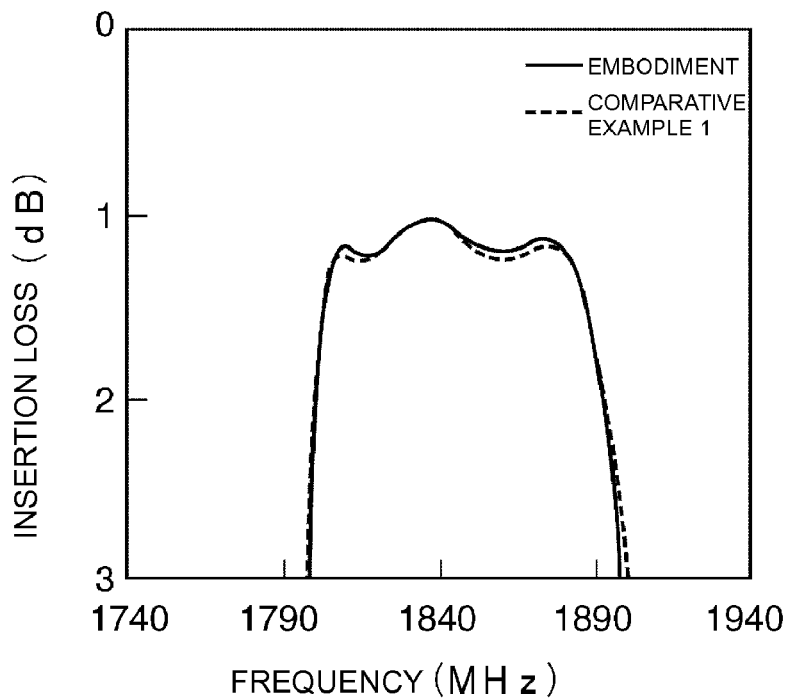
FIG. 2 shows the attenuation-frequency characteristics of the surface acoustic wave filter device according to the first preferred embodiment and the attenuation-frequency characteristics of a surface acoustic wave filter device according to Comparative Example 1.
Figure 3:
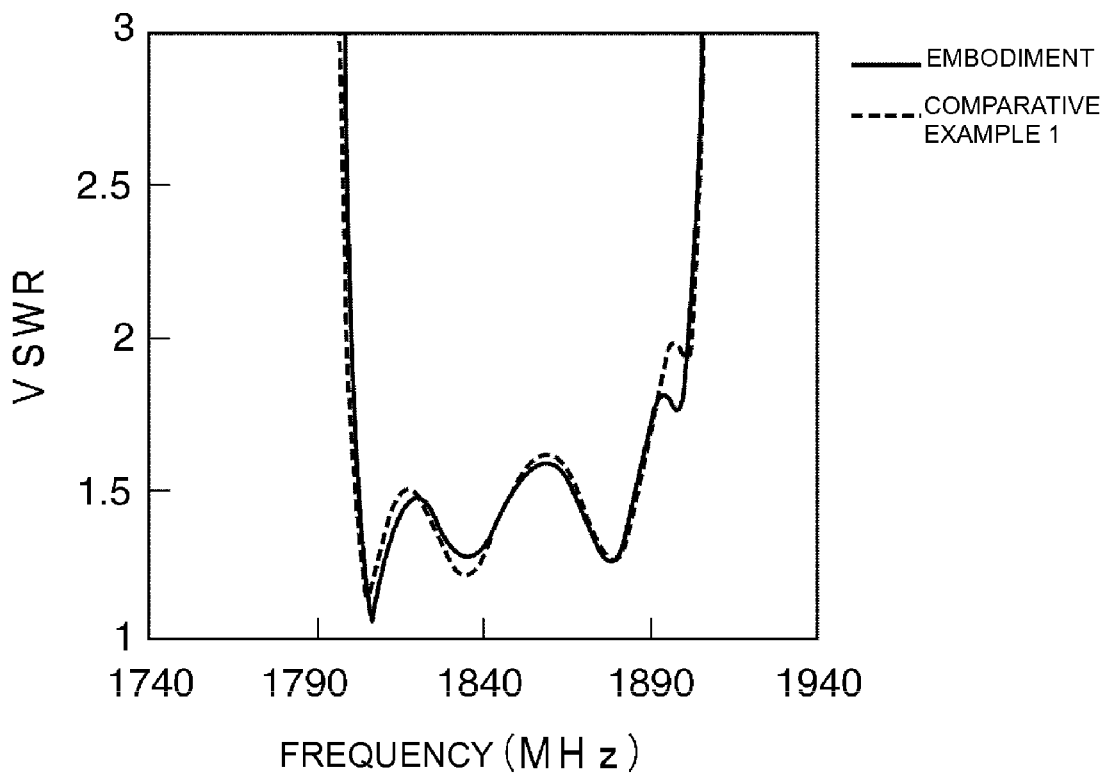
FIG. 3 shows the VSWR characteristics near an unbalanced terminal of the surface acoustic wave filter device according to the first preferred embodiment and the VSWR characteristics near an unbalanced terminal of the surface acoustic wave filter device according to Comparative Example 1.
Figure 4:
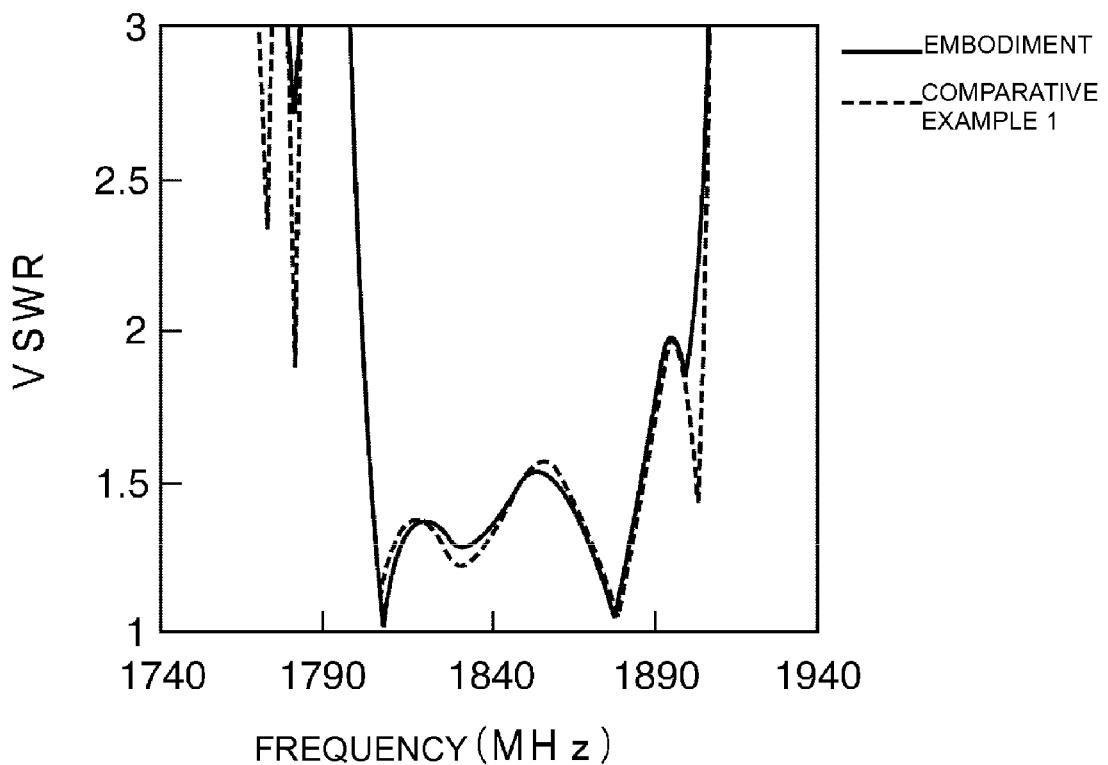
FIG. 4 shows the VSWR characteristics near a balanced terminal of the surface acoustic wave filter device according to the first preferred embodiment and the VSWR characteristics near a balanced terminal of the surface acoustic wave filter device according to Comparative Example 1.

For the surface acoustic wave filter device according to the preferred embodiment prepared as described above, the attenuation-frequency characteristics are represented by the solid line shown in FIG. 2, the VSWR characteristics near the unbalanced terminal are represented by the solid line shown in FIG. 3, and the VSWR characteristics near the balanced terminals are represented by the solid line shown in FIG. 4.

For the purpose of comparison, a surface acoustic wave filter device according to Comparative Example 1 was prepared in accordance with the following manner, and the attenuation-frequency characteristics and the VSWR characteristics were observed. Broken lines shown in FIGS. 2 to 4 represent observation results of Comparative Example 1.

Structure of Comparative Example 1

Comparative Example 1 was prepared to be similar to the surface acoustic wave filter device 1 according to the foregoing preferred embodiment with the exception of the points described below.

That is, in the surface acoustic wave filter device 1, the numbers of pairs of electrode fingers of the fourth to sixth IDTs 14 to 16 were changed as described below. That is, the number of pairs of electrode fingers of the IDT 14 is 7.5/(2.5), the number of pairs of electrode fingers of the IDT 15 is (1.5)/13.0/(1.5), and the number of pairs of electrode fingers of the IDT 16 is (2.5)/7.5. Since the total number of pairs of electrode fingers of the IDTs in the second surface acoustic wave filter section 7 is 79, the total number of pairs of electrode fingers is 39, which is equal to the total number of pairs of electrode fingers of the first longitudinally coupled resonator-type surface acoustic wave filter section 6, which is 39. In addition, the cross width of the electrode fingers of the surface acoustic wave resonator 9 is set to be equal to the cross width of the electrode fingers of the surface acoustic wave resonator 8.

As shown in FIGS. 2 to 4, although the insertion loss in a pass band, that is, the maximum insertion loss in the pass band, is about 1.3 dB in the surface acoustic wave filter device according to Comparative Example 1, the maximum insertion loss is improved to about 1.2 dB, which means an improvement of about 0.1 dB, in the surface acoustic wave filter device 1 according to the foregoing preferred embodiment. The improvement of the insertion loss in the pass band of about 0.1 dB is significantly important for a band-pass filter of a mobile communication apparatus. Thus, the improvement of about 0.1 dB is a huge improvement in the characteristics. In the vicinity of 1815 MHz and in the vicinity of 1860 MHz in which the transmission characteristics are greatly improved, an improvement of about 0.1 in the VSWR characteristics is achieved. That is, loss due to impedance mismatching is reduced, and thus the insertion loss is improved.

As described above, in the surface acoustic wave filter device 1 according to the foregoing preferred embodiment, since the total number of pairs in the second surface acoustic wave filter section 7 in which the polarities of electrode fingers that are adjacent to each other in an area in which the IDTs 14 to 16 are adjacent to each other are opposite to each other is greater than the total number of pairs of electrode fingers in the first surface acoustic wave filter section 6 in which the polarities of electrode fingers that are adjacent to each other in an area in which IDTs are adjacent to each other in a direction in which surface acoustic waves propagate are equal to each other, the insertion loss and the VSWR in the pass band are effectively improved.

In this preferred embodiment of the present invention, since the total number of pairs of electrode fingers of the IDTs in the second longitudinally coupled resonator-type surface acoustic wave filter section 7 is set to 41, which is greater than 39, which is the total number of pairs of electrode fingers in the first surface acoustic wave filter section 6, the insertion loss and the VSWR are improved. Such improvements are caused for the reasons described below.

In the gap between the IDT 11 and the IDT 12 and the gap between the IDT 12 and the IDT 13, electrode fingers that are connected to the ground potential are adjacent to each other with the corresponding gap therebetween. Thus, surface acoustic waves are not excited in the gap between the IDTs. In contrast, in the second surface acoustic wave filter section 7, in an area in which the IDT 14 and the IDT 15 are adjacent to each other and the gap between the IDT 15 and the IDT 16, an electrode finger connected to the ground potential and an electrode finger connected to a signal terminal are adjacent to each other. Thus, surface acoustic waves are excited in the corresponding gap.

Therefore, if design parameters for the first surface acoustic wave filter section 6 are the same as design parameters for the second surface acoustic wave filter section 7, the filter characteristics, in particular, the bandwidth of the first surface acoustic wave filter section differs from the filter characteristics, that is, the bandwidth of the second surface acoustic wave filter section 7. Thus, the bandwidth of the second surface acoustic wave filter section 7 is increased. As a result, according to Comparative Example 1, in the second surface acoustic wave filter section 7, the concentration of the impedance is reduced, the VSWR is deteriorated, and the insertion loss is increased.

In contrast, in the surface acoustic wave filter device 1 according to the foregoing preferred embodiment, since the total number of pairs of electrode fingers of the IDTs in the second surface acoustic wave filter section 7 is greater than the total number of pairs of electrode fingers of the IDTs in the first surface acoustic wave filter section 6, the filter characteristics, in particular, the bandwidth of the second surface acoustic wave filter section 7, is closer to the bandwidth of the first surface acoustic wave filter section 6. Thus, the VSWR and the insertion loss in the pass band are improved as described above.

In the foregoing preferred embodiment, not only do the total numbers of pairs of electrode fingers of the IDTs in the first surface acoustic wave filter section 6 and the second surface acoustic wave filter section 7 differ from each other, but design parameters for the surface acoustic wave resonator 8 and the surface acoustic wave resonator 9 also differ from each other. This is because since the optimal values of the other design parameters are changed when the total number of pairs of electrode fingers changes, the other design parameters are adjusted to the optimal values.

An advantage of the present invention cannot be achieved by setting the other design parameters to be different, but can be achieved by setting the total numbers of pairs of electrode fingers of the IDTs in the first surface acoustic wave filter section 6 and the second surface acoustic wave filter section 7 to be different from each other. This will be described below.

In the above-described surface acoustic wave filter device according to Comparative Example 1, each of the total numbers of pairs of electrode fingers of the IDTs in the first surface acoustic wave filter 6 and the second surface acoustic wave filter device 7 is set to 39, and the other design parameters for the first surface acoustic wave filter section 6, the second surface acoustic wave filter section 7, and the surface acoustic wave resonators 8 and 9 are optimized in accordance with the total numbers of pairs of electrode fingers of the IDTs.

A surface acoustic wave filter device according to Comparative Example 2 was prepared in the manner described below. That is, the numbers of pairs of electrode fingers of the IDTs in the first and second surface acoustic wave filter sections 6 and 7 are equal to the total number of pairs of electrode fingers in the surface acoustic wave filter section 7 according to the foregoing preferred embodiment, which is 41. In addition, the other design parameters are optimized in accordance with the total number of pairs of electrode fingers in the surface acoustic wave filter section 7 according to the foregoing preferred embodiment.

Figure 5:
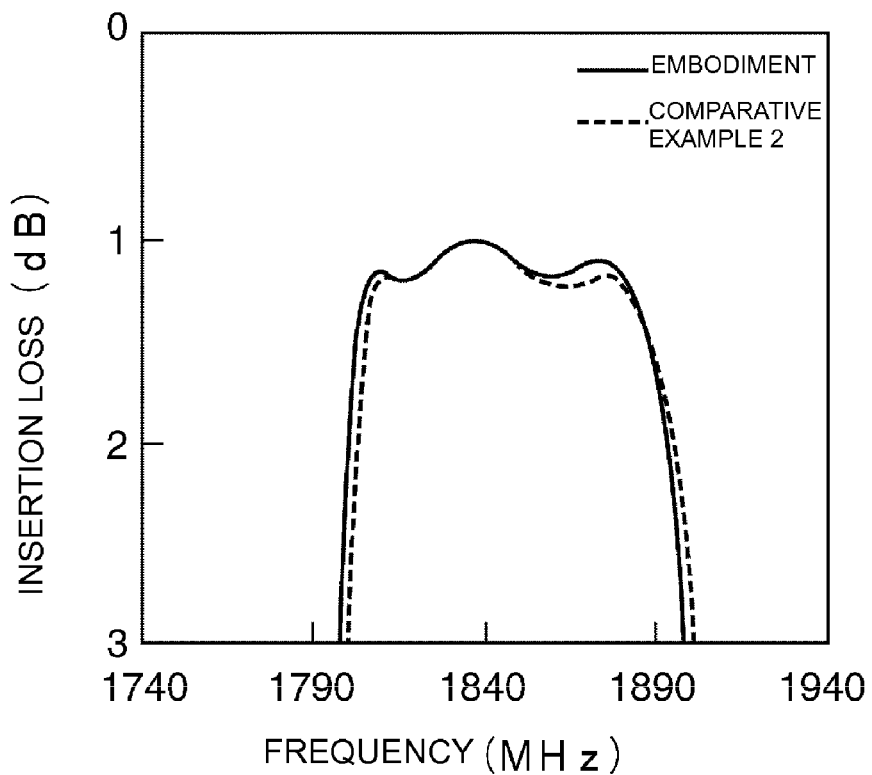
FIG. 5 shows the attenuation-frequency characteristics of the surface acoustic wave filter device according to the first preferred embodiment and the attenuation-frequency characteristics of a surface acoustic wave filter device according to Comparative Example 2.
Figure 6:
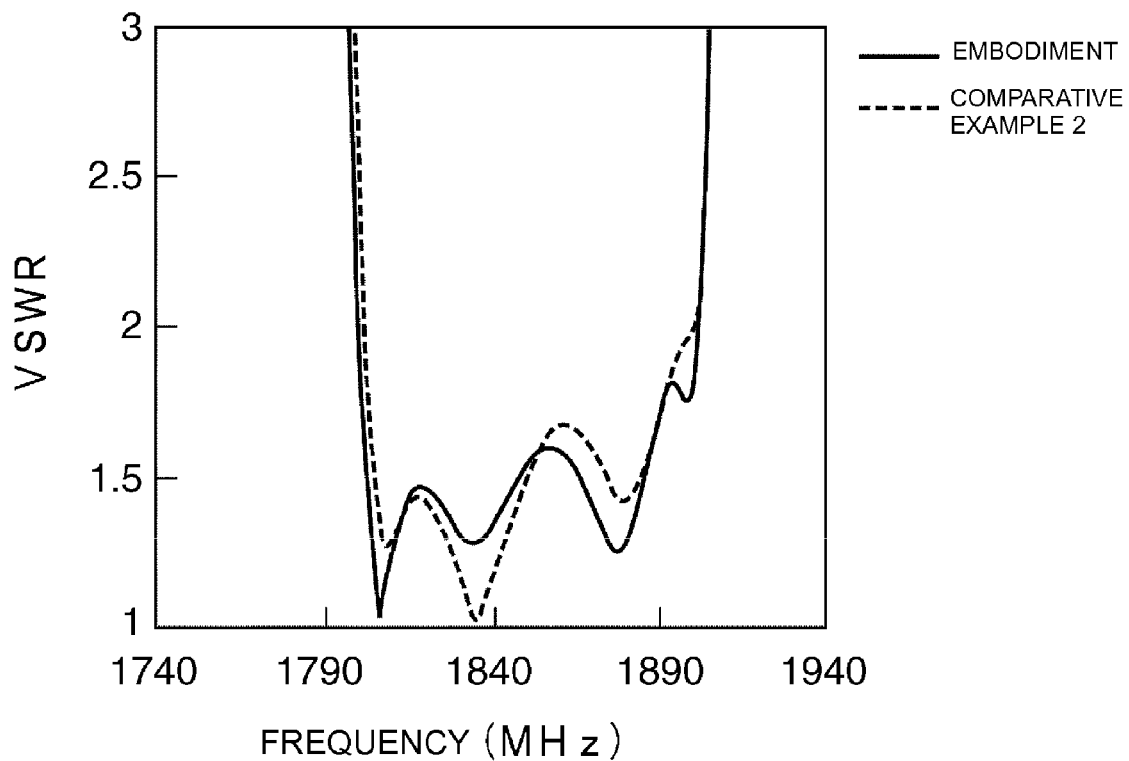
FIG. 6 shows the VSWR characteristics near the unbalanced terminal of the surface acoustic wave filter device according to the first preferred embodiment and the VSWR characteristics near an unbalanced terminal of the surface acoustic wave filter device according to Comparative Example 2.
Figure 7:
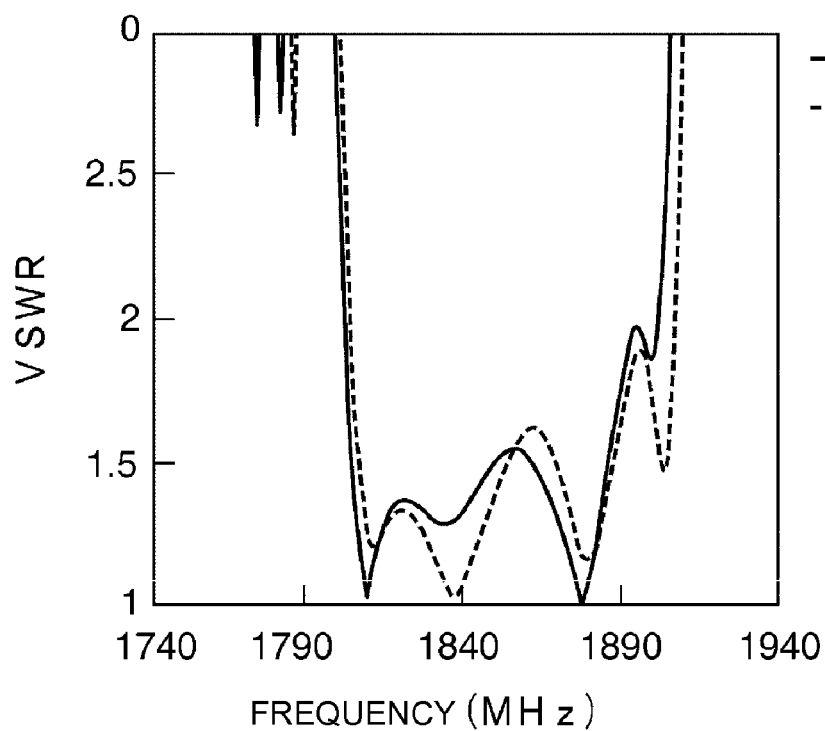
FIG. 7 shows the VSWR characteristics near the balanced terminal of the surface acoustic wave filter device according to the first preferred embodiment and the VSWR characteristics near a balanced terminal of the surface acoustic wave filter device according to Comparative Example 2.

The filter characteristics of the surface acoustic wave filter device according to Comparative Example 2 configured similarly to the foregoing preferred embodiment with the exception of the above-mentioned structure are shown in FIGS. 5 to 7, together with the filter characteristics of the surface acoustic wave filter device according to the foregoing preferred embodiment. In each of FIGS. 5 to 7, the solid line represents the characteristics of the surface acoustic wave filter device 1 according to the foregoing preferred embodiment and the broken line represents the characteristics of the surface acoustic wave filter device according to Comparative Example 2. FIG. 5 shows the attenuation-frequency characteristics, FIG. 6 shows the VSWR characteristics near the unbalanced terminals, and FIG. 7 shows the VSWR characteristics near the balanced terminals.

As shown in FIGS. 5 to 7, compared to the surface acoustic wave filter device according to Comparative Example 2, a lower insertion loss in a pass band and an excellent VSWR characteristic are achieved in the surface acoustic wave filter device 1 according to the foregoing preferred embodiment. That is, as shown in FIGS. 2 to 4 and in FIGS. 5 to 7, the advantage of the reduction in the insertion loss in the pass band is achieved not by setting the other design parameters so as to differ, but by setting the total number of pairs of electrode fingers of the IDTs in the first surface acoustic wave filter section 6 to be different from the total number of pairs of electrode fingers in the second surface acoustic wave filter section 7.

In the first preferred embodiment, each of the number of pairs in the fourth IDT 14 and the number of pairs in the sixth IDT 16 is increased by 1. However, one of the number of pairs in the fourth IDT and the number of pairs in the sixth IDT may be increased by 2. In such a case, parameters other than the number of pairs are also asymmetrical between left and right. Alternatively, only the number of pairs in the fifth IDT 15 may be increased by 2.

Figure 8:
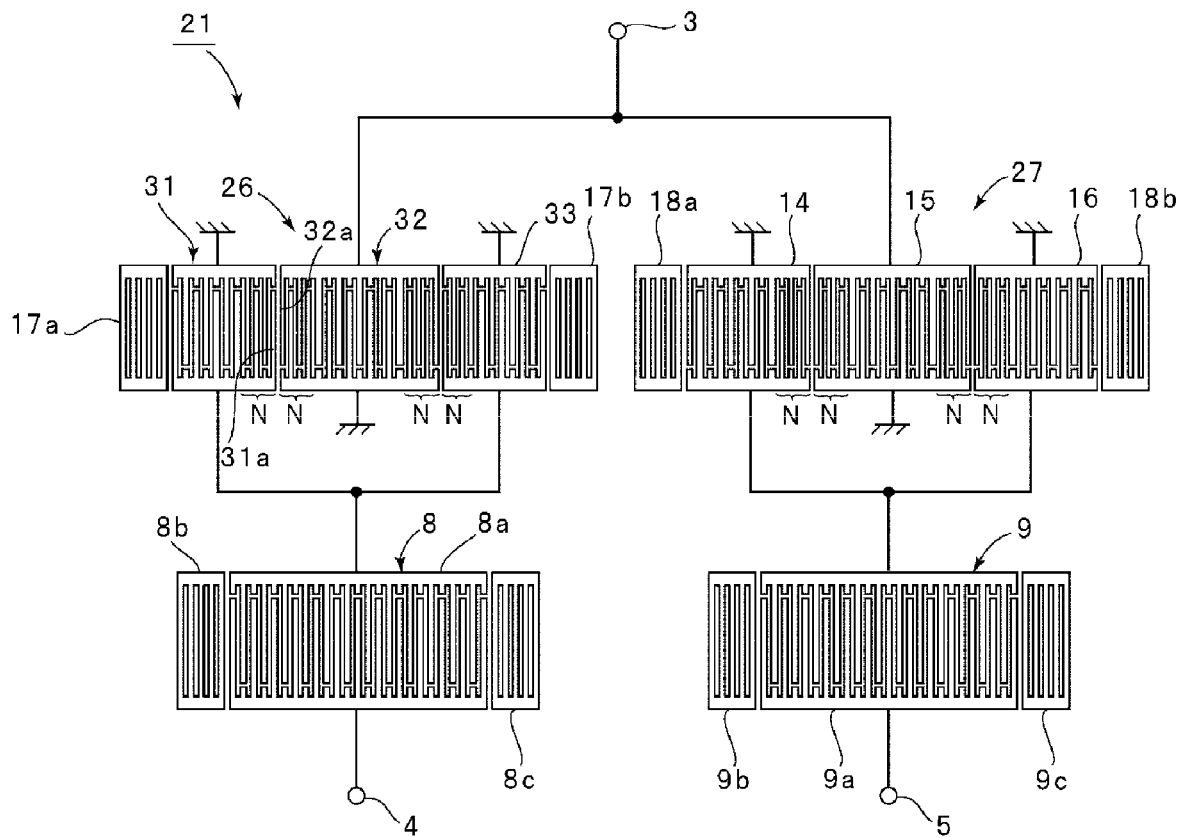
FIG. 8 is a schematic plan view of an electrode structure of a surface acoustic wave filter device according to a modification of the first preferred embodiment of the present invention.

FIG. 8 is a schematic plan view showing an electrode structure of a surface acoustic wave filter device according to a second preferred embodiment of the present invention. In a surface acoustic wave filter device 21 according to the second preferred embodiment, first and second longitudinally coupled resonator-type surface acoustic wave filter sections 26 and 27 each defined by three IDTs are connected to the unbalanced terminal 3. This preferred embodiment is different from the first preferred embodiment in that although electrode fingers that are connected to the ground potential are adjacent to each other across a gap therebetween in an area in which the IDTs 11 to 13 in the first surface acoustic wave filter section 6 are adjacent to each other in the surface acoustic wave filter device 1 according to the first preferred embodiment, each of the electrode fingers that are disposed on both sides of an area in which the IDTs are adjacent to each other is connected to a signal terminal in an area in which first to third IDTs 31 to 33 in the first surface acoustic wave filter section 26 are disposed in the second preferred embodiment. By way of example of the area in which the IDTs 31 and 32 are adjacent to each other, each of an electrode finger 31a of the IDT 31, which is near the IDT 32, and an outermost electrode finger 32a of the IDT 32, which is near the IDT 31, is connected to the balanced terminal 4 or the unbalanced terminal 3. That is, each of the outermost electrode fingers that are adjacent to each other across a gap therebetween is connected to a signal terminal.

The surface acoustic wave filter device 21 has a similar structure to the surface acoustic wave filter device 1 with the exception described above. Thus, the same parts as in the surface acoustic wave filter device 1 are referred to with similar reference numerals, and the explanations of those parts will be omitted.

It is known that a bandwidth is changed in accordance with the polarities of electrode fingers that are adjacent to each other across a gap between IDTs. In the first preferred embodiment, a pair of electrode fingers that are adjacent to each other across a gap therebetween is connected to the ground potential in the first surface acoustic wave filter section 6, and one of electrode fingers is connected to the ground potential and the other one of the electrode fingers is connected to a signal terminal in the second surface acoustic wave filter section 7. Thus, if the design parameters for the first and second surface acoustic wave filter devices 6 and 7 are the same, as in Comparative Example 1, the bandwidth of the second surface acoustic wave filter section 7 is inevitably increased. Thus, in the surface acoustic wave filter device according to the first preferred embodiment, by setting the total number of pairs of electrode fingers in the second surface acoustic wave filter section 7 to be greater than the total number of pairs of electrode fingers of the IDTs in the first surface acoustic wave filter section 6, the bandwidths of the two filter sections 6 and 7 approach each other, thus improving the VSWR and the insertion loss.

In contrast, in the surface acoustic wave filter device 21 according to the second preferred embodiment, each of the electrode fingers that are adjacent to each other across a gap between IDTs is connected to a signal terminal in the first surface acoustic wave filter section 26, and one of the electrode fingers that are adjacent to each other across a gap between IDTs is connected to the ground potential and the other one of the electrode fingers is connected to a signal terminal in the second surface acoustic wave filter section. In this case, as in the first preferred embodiment, if the design parameters for the first and second surface acoustic wave filter sections 26 and 27 are the same, the bandwidth of the second surface acoustic wave filter section 27 is larger than the bandwidth of the first surface acoustic wave filter section 26. Thus, in the second preferred embodiment, the total number of pairs of electrode fingers of the IDTs in the second surface acoustic wave filter section 27 is set to be greater than the total number of pairs of electrode fingers of the IDTs in the first surface acoustic wave filter section 26.

Thus, the bandwidth of the second surface acoustic wave filter section 27 approaches the bandwidth of the first surface acoustic wave filter section 26. Therefore, as in the first preferred embodiment, the insertion loss and the VSWR in the pass band is improved.

An acoustic wave filter device according to the present invention is not limited to the structure of the first and second preferred embodiments. Various modifications can be made to the present invention.

Figure 9:
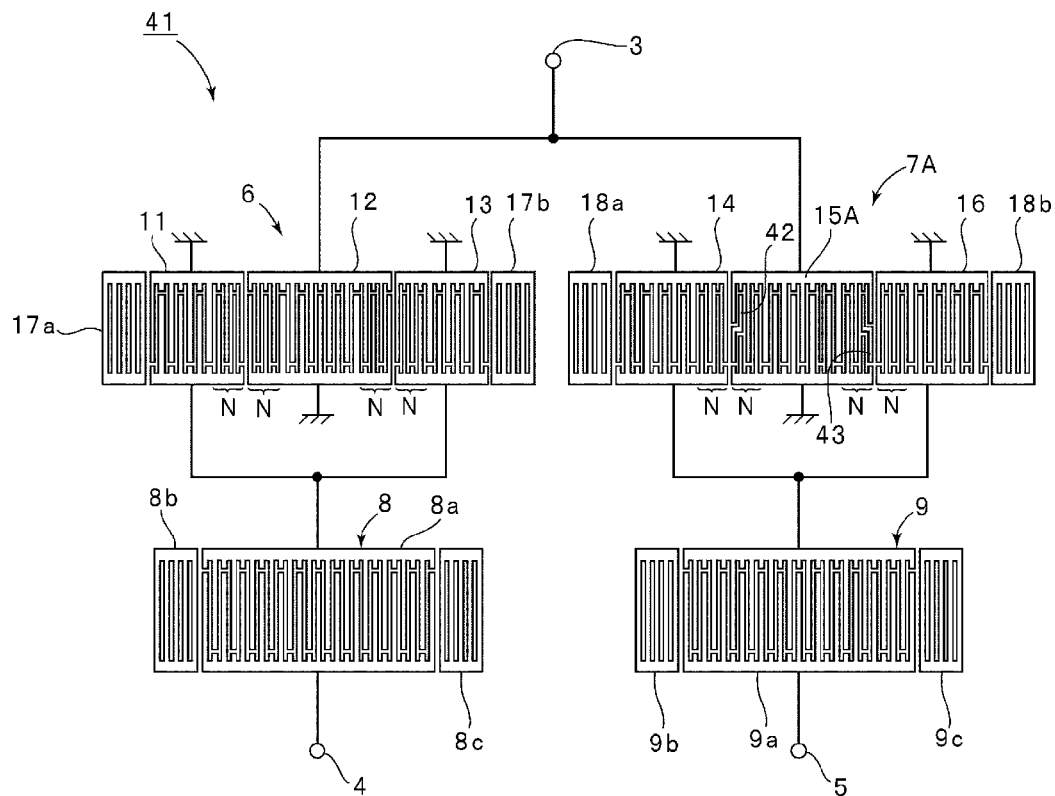
FIG. 9 is a schematic plan view of an electrode structure of a surface acoustic wave filter device according to another modification of the first preferred embodiment of the present invention.

FIG. 9 is a schematic plan view of a modification of the surface acoustic wave filter device 1 according to the first preferred embodiment. A surface acoustic wave filter device 41 is configured similarly to the first surface acoustic wave filter device 1 with the exception that a fifth IDT 15A in the middle is subjected to series weighting in a second surface acoustic wave filter section 7A.

Series weighting is a method for assigning weights to a plurality of electrode fingers including the outermost electrode fingers such that floating electrode fingers 42 and 43 are disposed in locations where the outermost electrode finger and at least one neighboring electrode finger of the IDT 15A are provided. With such a series weighting, the bandwidth of the second surface acoustic wave filter section 7A can be further adjusted. That is, although the total number of pairs of electrode fingers in the second surface acoustic wave filter section 7A is set to be greater than the total number of pairs of electrode fingers in the first surface acoustic wave filter section 6 and the bandwidths of the first and second surface acoustic wave filter section 6 and 7A approach each other, the bandwidth of the second surface acoustic wave filter section 7A can be closer to the bandwidth of the first surface acoustic wave filter section 6 by the above-mentioned series weighting.

As described above, according to various preferred embodiments of the present invention, in order to cause the bandwidths of the first and second surface acoustic wave filter sections to approach each other, various types of weighting, such as series weighting, may be used, in addition to setting the total number of pairs of electrode fingers in the second surface acoustic wave filter section to be greater than the total number of pairs of electrode fingers of the IDTs in the first surface acoustic wave filter section. Apart from series weighting, for example, withdrawal weighting or apodization weighting may be used.

Figure 10:
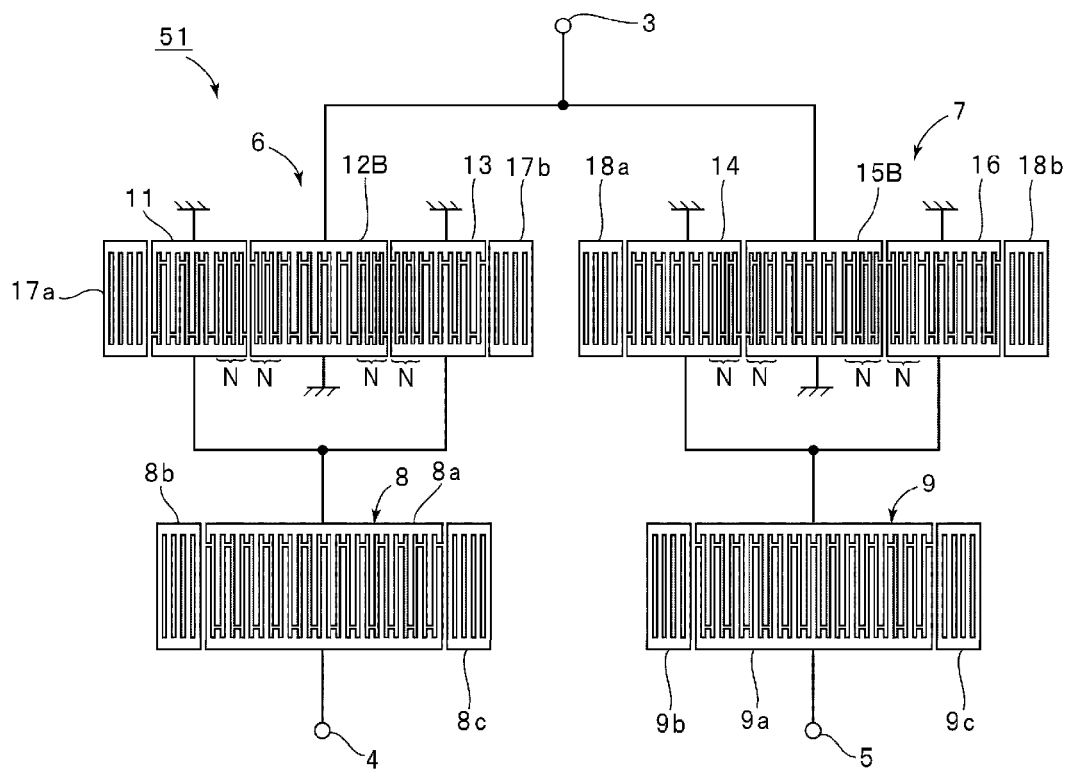
FIG. 10 is a schematic plan view of an electrode structure of a surface acoustic wave filter device according to another modification of the first preferred embodiment of the present invention.

FIG. 10 is a schematic plan view of an electrode structure of a surface acoustic wave filter device according to another modification of the surface acoustic wave filter device 1 according to the first preferred embodiment.

In the surface acoustic wave filter device 1, the number of electrode fingers of each of the IDTs 12 and 15 in the middle in the first and second surface acoustic wave filter sections 6 and 7 is odd. However, in a surface acoustic wave filter device 51, the number of electrode fingers of each of the second and fifth IDTs 12B and 15B is even. The surface acoustic wave filter device 51 is configured similarly to the surface acoustic wave device 1 with the exception of the above-mentioned point.

In the surface acoustic wave filter device 51, electrode fingers that are connected to the ground potential are adjacent to each other across a gap therebetween in an area in which the IDT 11 and an IDT 12B are adjacent to each other in the first surface acoustic wave filter section, and each of electrode fingers that are adjacent to each other across a gap therebetween in an area in which the IDT 12B and the IDT 13 are adjacent to each other is connected to a signal terminal. In contrast, an electrode finger that is connected to the ground potential and an electrode finger that is connected to a signal terminal are adjacent to each other in an area in which IDTs are adjacent to each other in the second surface acoustic wave filter section 7.

As described above, in the first surface acoustic wave filter section 6, a pair of electrode fingers is not necessarily connected to the ground potential. Each of the pair of electrode fingers may be connected to a signal terminal as long as the polarities of electrode fingers that are adjacent to each other across a gap therebetween are the same in an area in which IDTs are adjacent to each other. In such a case, by setting the total number of pairs of electrode fingers of the IDTs in the second surface acoustic wave filter section 7 to be greater than the total number of pairs of electrode fingers in the first surface acoustic wave filter section 6, the bandwidths of the first surface acoustic wave filter section 6 and the second surface acoustic wave filter section 7 approach each other. Thus, similar to the first surface acoustic wave filter device 1, the insertion loss and the VSWR in a pass band are improved.

Figure 11:
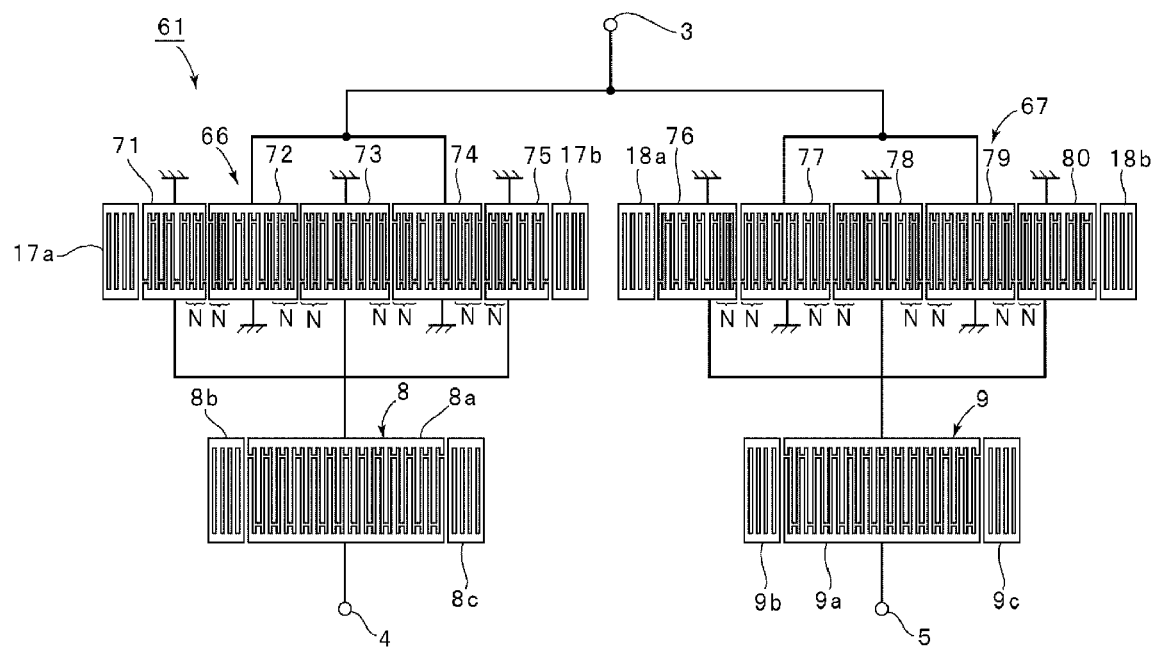
FIG. 11 is a schematic plan view of an electrode structure of a surface acoustic wave filter device according to a second preferred embodiment of the present invention.

FIG. 11 is a schematic plan view of an electrode structure of a surface acoustic wave filter device according to a third preferred embodiment of the present invention. In a surface acoustic wave filter device 61, first and second surface acoustic wave filter sections 66 and 67 are longitudinally coupled resonator-type surface acoustic wave filter sections including first to fifth IDTs 71 to 75 and sixth to tenth IDTs 76 to 80, respectively. The surface acoustic wave filter device 61 is configured similarly to the surface acoustic wave filter device 1 with the exception of the above-mentioned point. As described above, in the present invention, the first and second surface acoustic wave filter sections may be longitudinally coupled resonator-type surface acoustic wave filter sections each defined by five IDTs. In this preferred embodiment, the total number of pairs of electrode fingers of the IDTs in the second longitudinally coupled resonator-type surface acoustic wave filter section 67 is set to be greater than the total number of pairs of electrode fingers of the IDTs in the first surface acoustic wave filter section 66. Thus, the insertion loss and the VSWR in a pass band are improved.

Figure 12:
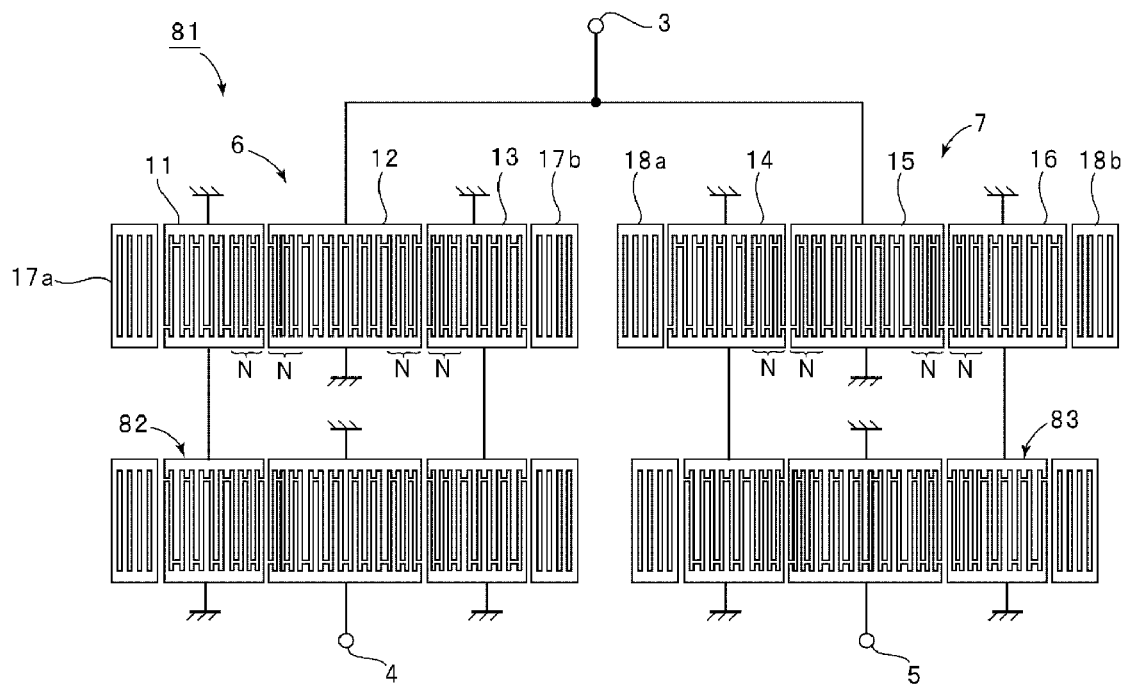
FIG. 12 is a schematic plan view of an electrode structure of a surface acoustic wave filter device according to a third preferred embodiment of the present invention.

FIG. 12 is a schematic plan view of an electrode structure of a surface acoustic wave filter device according to a fourth preferred embodiment of the present invention. In a surface acoustic wave filter device 81 shown in FIG. 12, longitudinally coupled resonator-type surface acoustic wave filter sections 82 and 83 each defined by three IDTs are connected in a cascade arrangement downstream of the first and second surface acoustic wave filter sections 6 and 7, respectively, of the surface acoustic wave filter device 1 according to the first preferred embodiment.

In this case, if the total number of pairs of electrode fingers in the second surface acoustic wave filter section 7 is set to be greater than the total number of pairs of electrode fingers of the IDTs in the first surface acoustic wave filter section 6, that is, if the surface acoustic wave filter device is configured similarly to the surface acoustic wave filter device 1 according to the first preferred embodiment, improvements in the insertion loss and the VSWR in the pass band are achieved. That is, the total number of pairs of electrode fingers in the surface acoustic wave filter section 82 may be equal to the total number of pairs of electrode fingers in the surface acoustic wave filter section 83.

In FIG. 12, a single surface acoustic wave filter section 82 and a single surface acoustic wave filter section 83 are connected in a cascade arrangement to the first surface acoustic wave filter section 6 and the second surface acoustic wave filter section 7, respectively. However, two or more surface acoustic wave filter sections may be connected in a cascade arrangement to each of the first and second surface acoustic wave filter sections 6 and 7. When a plurality of surface acoustic wave filter sections is connected in a cascade arrangement to each of the first and second surface acoustic wave filter section 6 and 7, the number of surface acoustic wave filter sections is not particularly limited.

The surface acoustic wave filter devices according to the foregoing preferred embodiments and modifications use surface acoustic waves, as described above. In the present invention, instead of surface acoustic waves, other acoustic waves, such as boundary acoustic waves, may be used.

Figure 13:
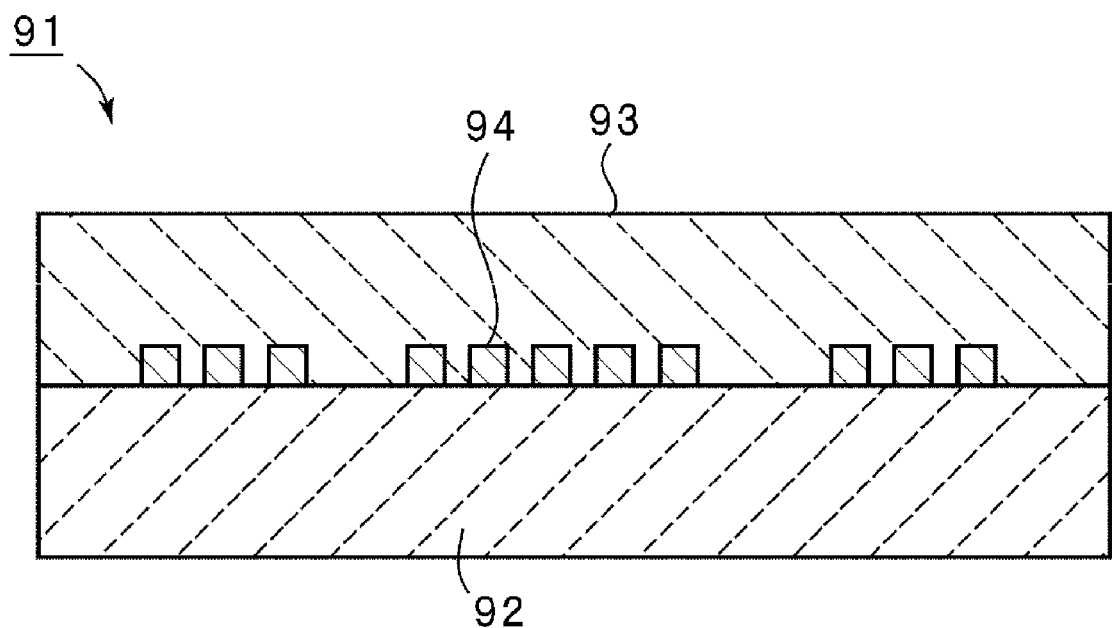
FIG. 13 is a schematic sectional view for explaining the structure of a boundary acoustic wave device.
Figure 14:
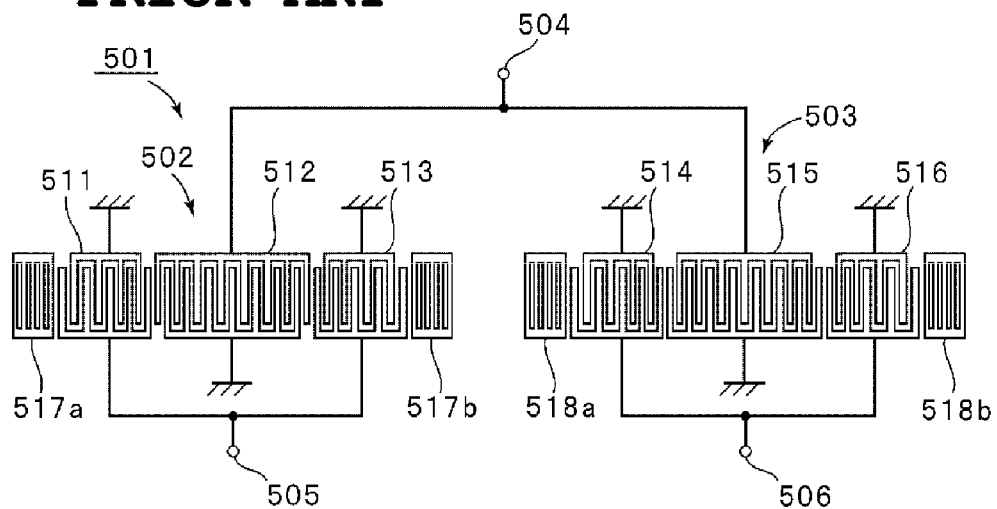
FIG. 14 is a schematic plan view of an electrode structure of a surface acoustic wave filter device of the related art.

FIG. 13 is a sectional view schematically showing a structure of a boundary acoustic wave filter device. A boundary acoustic wave filter device 91 is formed by laminating a piezoelectric substrate 92 defining a first medium layer and a dielectric material 93 defining a second medium layer. A plurality of electrodes 94 including IDTs is formed in a boundary between the piezoelectric substrate 92 and the dielectric material 93. A filter characteristic is achieved by using boundary acoustic waves propagating in the boundary. In this case, when the structure of the electrodes 94 in the boundary acoustic wave filter device 91 is similar to the electrode structure in the surface acoustic wave filter device according to each of the foregoing preferred embodiments and modifications thereto, an acoustic wave filter device according to the present invention is provided.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced acoustic wave filter device comprising:
   a piezoelectric substrate; and
   first and second longitudinally coupled resonator-type acoustic wave filter sections provided on the piezoelectric substrate; wherein
   each of the first and second acoustic wave filter sections includes a plurality of IDTs disposed in a direction in which surface acoustic waves propagate;
   one of an input and an output of each of the first and second acoustic wave filter sections is connected to an unbalanced terminal;
   the other of the input and the output of the first acoustic wave filter section is connected to a first balanced terminal, the other of the input and the output of the second acoustic wave filter section is connected to a second balanced terminal, and the phase of a signal of the other of the input and the output of the first acoustic wave filter section is different from the phase of a signal of the other of the input and the output of the second acoustic wave filter section by 180 degrees;
   in the first acoustic wave filter section, the polarities of electrode fingers that are adjacent to each other in an area in which the IDTs are adjacent to each other in a direction in which acoustic waves propagate are equal to each other;
   in the second acoustic wave filter section, the polarities of electrode fingers that are adjacent to each other in an area in which the IDTs are adjacent to each other are opposite to each other; and
   the total number of pairs of electrode fingers of the plurality of IDTs in the second acoustic wave filter section is greater than the total number of pairs of electrode fingers of the plurality of IDTs in the first acoustic wave filter section.

2. The balanced acoustic wave filter device according to claim 1, further comprising:
at least one third longitudinally coupled resonator-type surface acoustic wave filter section that is connected in a cascade arrangement to the first acoustic wave filter section; and
at least one fourth longitudinally coupled resonator-type surface acoustic wave filter section that is connected in a cascade arrangement to the second acoustic wave filter section.

3. The balanced acoustic wave filter device according to claim 1, wherein in the areas in which the IDTs are adjacent to each other, each of the IDTs includes a narrow-pitched electrode finger portion having an electrode finger pitch that is narrower than an electrode finger pitch of the other portions of the corresponding IDT.

4. The balanced acoustic wave filter device according to claim 1, wherein surface acoustic waves are used as the acoustic waves so as to define a surface acoustic wave filter device.

5. The balanced acoustic wave filter device according to claim 1, wherein boundary acoustic waves are used as the acoustic waves so as to define a boundary acoustic wave filter device.

6. The balanced acoustic wave filter device according to claim 1, wherein the total number of pairs of electrode fingers of the plurality of IDTs in the second acoustic wave filter section is greater than the total number of pairs of electrode fingers of the plurality of IDTs in the first acoustic wave filter section by two pairs.

7. The balanced acoustic wave filter device according to claim 1, wherein each of the first and second acoustic wave filter sections includes three IDTs.

8. The balanced acoustic wave filter device according to claim 7, wherein a middle one of the three IDTs of each of the first and second acoustic wave filter sections includes an odd number of electrode fingers.

9. The balanced acoustic wave filter device according to claim 7, wherein a middle one of the three IDTs of each of the first and second acoustic wave filter sections includes an even number of electrode fingers.

10. The balanced acoustic wave filter device according to claim 1, wherein at least one of the IDTs of the second acoustic wave filter section is series weighted.

11. The balanced acoustic wave filter device according to claim 1, wherein at least one of the IDTs of the second acoustic wave filter section is withdrawal weighted.

12. The balanced acoustic wave filter device according to claim 1, wherein at least one of the IDTs of the second acoustic wave filter section is apodization weighted.

13. The balanced acoustic wave filter device according to claim 1, wherein each of the first and second acoustic wave filter sections includes five IDTs.

14. The balanced acoustic wave filter device according to claim 1, wherein each of the first and second acoustic wave filter sections further includes reflectors arranged to sandwich the plurality of IDTs therebetween in the direction in which surface acoustic waves propagate.

* * * * *